United States Patent
Wills et al.

(10) Patent No.: US 6,281,563 B1
(45) Date of Patent: Aug. 28, 2001

(54) LASER PROGRAMMING OF CMOS SEMICONDUCTOR DEVICES USING MAKE-LINK STRUCTURE

(75) Inventors: Kendall Scott Wills, Houston; Paul A. Rodriguez, Lewisville, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 1086 days.

(21) Appl. No.: 08/846,949

(22) Filed: Apr. 30, 1997

Related U.S. Application Data

(60) Continuation of application No. 08/485,590, filed on Jun. 7, 1995, now abandoned, which is a division of application No. 08/070,487, filed on Jun. 2, 1993, now Pat. No. 5,960,263, which is a continuation of application No. 07/692,088, filed on Apr. 26, 1991, now abandoned.

(51) Int. Cl.$^7$ .................................................. H01L 29/00
(52) U.S. Cl. ......................... 257/530; 257/329; 257/928; 257/529
(58) Field of Search .................................. 257/928, 529, 257/379, 530

(56) References Cited

U.S. PATENT DOCUMENTS

| | | | |
|---|---|---|---|
| 3,733,690 | 5/1973 | Rizzi | 437/922 |
| 4,387,503 | 6/1983 | Aswell | 437/56 |
| 4,561,906 | 12/1985 | Calder | 437/19 |
| 4,783,424 | 11/1988 | Ohno | 437/922 |
| 4,853,758 | * 8/1989 | Fischer | 257/529 |

FOREIGN PATENT DOCUMENTS 81654   4/1986   (JP).

* cited by examiner

*Primary Examiner*—Jerome Jackson, Jr.
(74) *Attorney, Agent, or Firm*—Ronald O. Neerings; Wade James Brady, III; Frederick J. Telecky, Jr.

(57) ABSTRACT

A CMOS semiconductor device is programmed by a laser beam which causes a PN junction in a silicon substrate to be permanently altered. This produces a leakage path between a program node and a tank region in the substrate; the program node can be an input to a transistor in a CMOS circuit, for example, so this node will always hold the transistor on or off depending whether or not it has been laser-programmed. Preferably, the tank region is of opposite type compared to the substrate, so the program node is electrically isolated from the substrate in either case.

8 Claims, 4 Drawing Sheets

US 6,281,563 B1

LASER PROGRAMMING OF CMOS SEMICONDUCTOR DEVICES USING MAKE-LINK STRUCTURE

This application is a Continuation of application Ser. No. 08/485,590, filed Jun. 7, 1995, abandoned which is a Divisional of application Ser. No. 08/070,487, filed Jun. 2, 1993, now U.S. Pat. No. 5,960,263 which is a Continuation of application Ser. No. 07/692,088, filed Apr. 26, 1991 abandoned.

BACKGROUND OF THE INVENTION

This invention relates to semiconductor devices, and more particularly to laser programming of such devices.

Various methods have been employed for selectively programming semiconductor devices after manufacture is essentially complete. The type of semiconductor device ultimately used is a key determining factor in deciding which programming method to use.

For semiconductors of the MOS type, it is a given that the substrate is biased at a known voltage. For microprocessors the substrate is biased at ground. A microprocessor does not have the requirement for long term charge storage in capacitors where one side of the structure is the substrate. One method for programming elements in an NMOS integrated circuit is disclosed in U.S. Pat. No. 4,387,503 to Aswell et al. Aswell teaches that semiconductor devices (NMOS circuit is shown) can be programmed by means of a laser by damaging the n moat in a p substrate, damaging the substrate under the gate of an n channel transistor or damaging the dielectric between the gate metal and the n moat of an n channel transistor. The programming method taught by Aswell can be an effective programming method as long as the substrate is biased at ground. Aswell does not, however, take into account a substrate biased at a negative potential.

For NMOS and CMOS DRAMs the substrate is held at a negative voltage. The negative voltage may be –4 volts. Damaging a junction with the substrate, as taught by Aswell, creates problems when the substrate is biased at –4 volts. The –4 volt signal is transmitted through the circuit which is typically designed to operate between ground and Vcc, typically +5 volts for CMOS and NMOS devices. The extra voltage presents difficulties for the transistors. Moreover, many CMOS devices are also designed for low power consumption. If the programming method of Aswell is used, the voltage drop is from Vcc to the substrate potential Vbb. In conventional CMOS and NMOS circuits, the substrate is biased at ground, in which case no problems should arise with laser diode programming. If, however, the substrate is biased to –4 volts, as is conventional with some DRAMs, increased voltage drops equivalent to 9 volts may be seen by the circuit transistors. Such a result is inconsistent with shrinking design size and low power consumption. The increased voltage drop creates breakdown design problems from the transistor source to drain as well as large voltage drops across the gate oxide. Both problems increase the power consumption of the device. To further complicate the problem Vbb on an NMOS or CMOS DRAM is typically produced with a substrate pump which has a limited current carrying capacity. If a junction with the substrate is damaged, the charge pump may not be able to handle the increase in leakage to the substrate. Even worse, the charge pump may be redesigned larger causing it to draw more current at all times. This is counter to the requirements of the CMOS environment where the device is to have as low a power consumption as possible.

It is the principal objective of this invention to provide an improved method of programming of semiconductor devices, particularly by laser beam make-link programmable elements. Another objective is to provide an improved method of programming MOS devices having a substrate biased at a negative voltage. Yet another objective is to provide a laser programming method which requires less space on the semiconductor substrate for implementation. A further objective is to provide a laser programming method which is less disruptive of the surrounding structure and materials, and/or which leaves a minimum of residue. Other objectives include lower dwell time needed for the leaser beam (thus faster programming) and lower power (thus less heating).

SUMMARY OF THE INVENTION

In accordance with one embodiment of the invention, a semiconductor device is programmed by a laser beam which causes a PN junction in a silicon substrate to be permanently altered. This produces a leakage path between a program node and the tank; the program node can be connected to a transistor gate in a CMOS circuit, for example, so this node will always hold the transistor at a known state if the node has been laser programmed. Otherwise, the transistor gate may float to an unknown state. Preferably, the tank region is of opposite type compared to the substrate, so the program node is electrically isolated from the substrate in either case.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
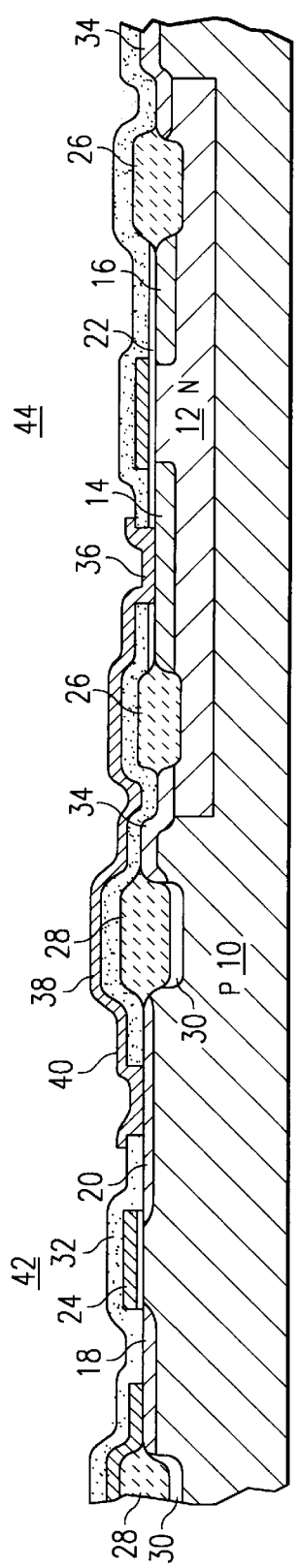
FIG. 1 is an elevation view in section of a small part of a semiconductor chip, having one P-channel and one N-channel transistor.

Referring to FIG. 1, a CMOS type semiconductor device is illustrated. A silicon substrate 10, in this case P type, has an N tank 12 formed in the top face, in the manner of U.S. Pat. No. 4,295,897, assigned to Texas Instruments. The substrate can be N type and a P type tank used, in which case the conductivity types of the regions are reversed.

The N tank version includes: P moat diffusion regions 14 and 16 and N moat diffusion regions 18 and 20, which serve as source/drain regions; gates 22 and 24; field oxide regions 26 and 28 with channel stop regions 30 below field oxide regions 28; an interconnection layer 31; an interlevel oxide layer 32; an N+ diffusion guard ring 34; contact areas 36 and 38; and a metal strip 40. Transistor 42 includes N moat diffusion regions 18 and 20 and gate 24. Transistor 44 includes P moat diffusion regions 14 and 16 and gate 22.

Figure 2:
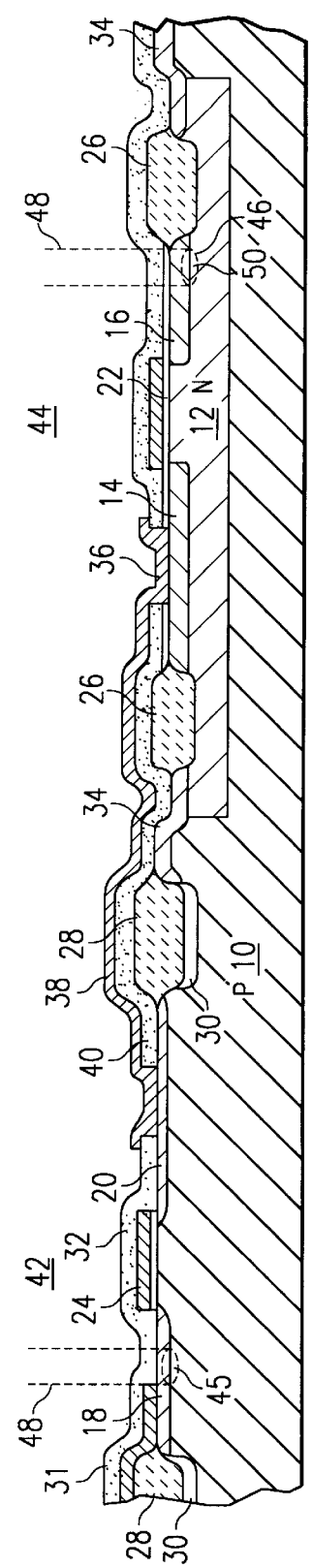
FIG. 2 is an elevation view in section of a small part of a semiconductor chip, having one P-channel and one N-channel transistor, having the make-link laser beam programmable structure of the invention.
Figure 3:
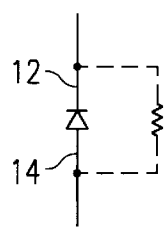
FIG. 3 is an electrical schematic diagram of the circuit of the device of FIG. 2, according to the invention.

In a first embodiment of the invention, shown in FIG. 2, a programming area 46 is provided which is spaced from gate 22. A laser beam 48 is focused onto area 46 with a beam of energy sufficient to cause damage resulting in a permanent leakage path at pn junction area 50 due to heating. The beam energy need not be high enough to melt oxide layer 32 or the silicon of P moat region 16. For example, the beam energy might be 0.5 uj, with a dwell time of 35 nsec and a spot size of about 6 to 8 microns. As indicated in FIG. 3, when the pn junction area 50 is irradiated, the diode is permanently replaced by a shorting resistor R. N moat diffusion 18 can also have a programming area 45, formed in the manner previously discussed, if the P substrate 10 is held at ground potential or if the substrate bias is taken into account in the design of associated circuitry.

Figure 4:
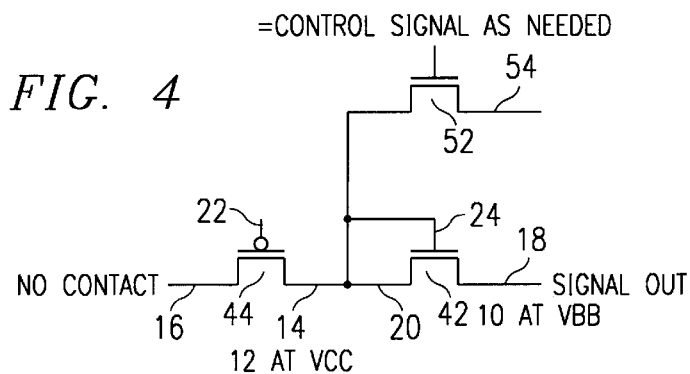
FIGS. 4–15 are electrical schematics of various embodiments of the invention.

FIG. 4 shows an available electrical equivalent circuit resulting from the programming of the first embodiment. Damage to the pn junction of P moat diffusion 16 to N tank diffusion 12 results in transistor 42 being turned on when transistor 44 is turned on. If the pn junction of P moat diffusion 16 and N tank diffusion 12 is not damaged, the signal out will be determined by what is happening to transistor 42 because of bleeder transistor 52. Typically, source/drain 54 is at ground.

Figure 5:
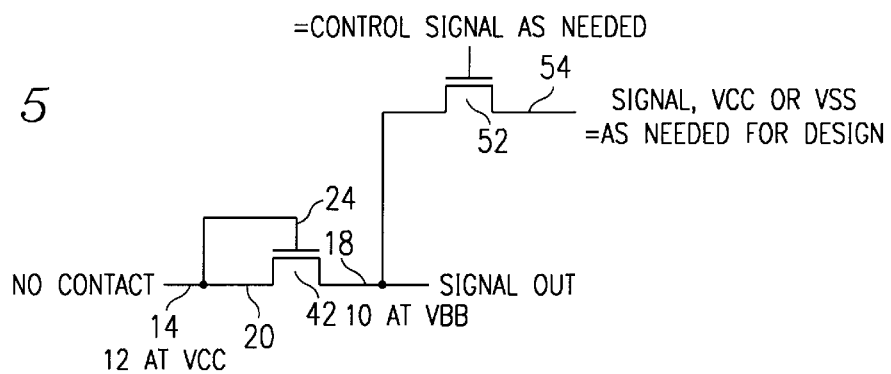

In a second embodiment of the invention, the pn junction of N moat diffusion 20 to P substrate 10 is damaged away from gate 24, or the pn junction of P moat diffusion 14 to N tank diffusion 12 is damaged in the previously discussed manner. An available electrical equivalent circuit is shown in FIG. 5. Damage to the pn junction of N moat diffusion 20 to P substrate 10 or the pn junction of P moat diffusion 14 to N tank diffusion 12 will result in control of transistor 42. Damage to the pn junction of N moat diffusion 20 to P substrate 10 shuts off transistor 42 so the signal out is totally determined by transistor 52. Either the pn junction between P moat diffusion 14 to N tank diffusion 12 or the pn junction between N moat diffusion 20 to P substrate 10 must be damaged to prevent gate 24 from floating. When P moat diffusion 14 is damaged, transistor 42 is turned on and signal out is Vcc combined with the signal from transistor 52.

Figure 6:
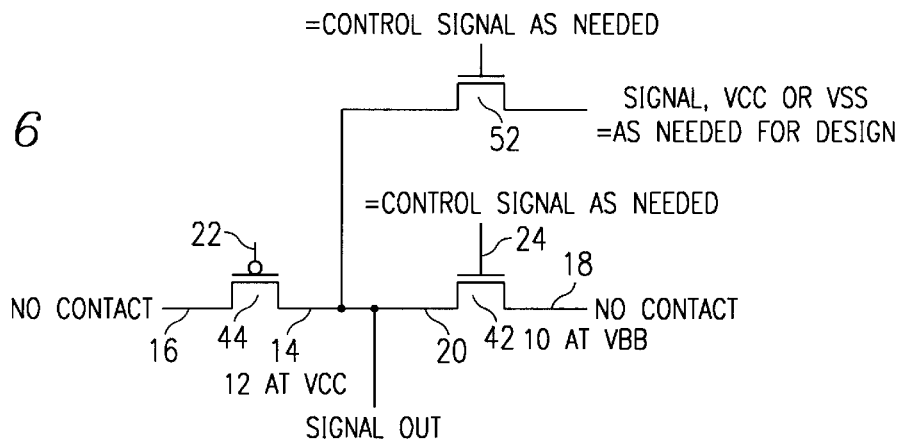

In a third embodiment of the invention, the pn junction of P moat diffusion 16 to N tank diffusion 12 is damaged away from gate 22, or the pn junction of N moat diffusion 18 to P substrate 10 is damaged away from gate 24, in the previously discussed manner. An available electrical equivalent circuit is shown in FIG. 6. If either pn junction is damaged, signal out is controlled by the results of turning on transistors 44, 42 and 52. Transistors 44, 42 and 52 may all be turned on at once or phased to develop a complex signal.

Figure 7:
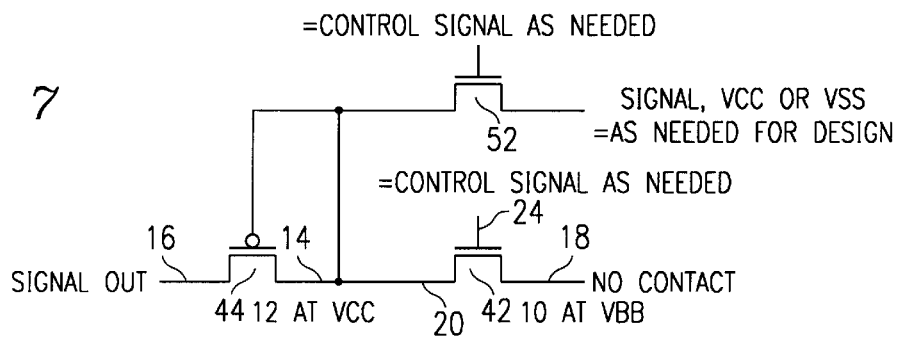

In a fourth embodiment of the invention, the pn junction of N moat diffusion 18 to P substrate 10 is damaged away from gate 24, in the previously discussed manner. An available electrical equivalent circuit is shown in FIG. 7. When gate 24 is turned on, the signal out will control transistor 44 in combination with transistor 52. This embodiment is recommended for microprocessors where the p substrate 10 is at Vss, not at Vbb. This embodiment is not, however, recommended for DRAMs having their substrate 10 at Vbb (−4 volts), since the voltage across transistor 44 will be Vcc+Vbb, unless considered in the design.

Figure 8:
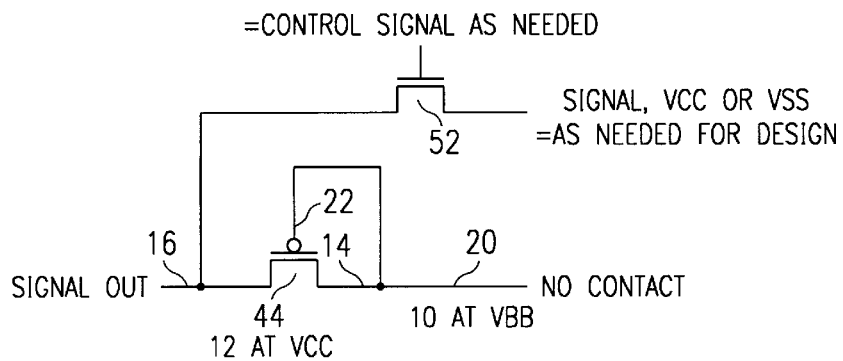

In a fifth embodiment of the invention, the pn junction of P moat diffusion 14 to N tank diffusion 12 is damaged away from gate 22, or the pn junction of N moat diffusion 20 to P substrate 10 is damaged in the previously discussed manner. An available electrical equivalent circuit is shown in FIG. 8. Damage to either pn junction will result in control of transistor 44. Damage to the pn junction of P moat diffusion 14 to N tank diffusion 12 shuts off transistor 44 so that signal out is totally determined by transistor 52. Damage to the pn junction of N moat diffusion 20 to P substrate 10 results in a signal out of Vbb. This result would require that transistor 52 remain a bleeder transistor. Otherwise, the signal out may be a combination of the outputs from transistors 44 and 52. It should be noted that the −4 volts of Vbb might present a problem with gate oxide integrity. This embodiment will work well on a device where Vbb=Vss. Either the pn junction of P moat diffusion 14 to N tank diffusion 12 or the pn junction of N moat diffusion 20 to P substrate 10 must be damaged to prevent gate 22 from floating. In actual practice, gate 22 can float without harm to the circuit function as p moat diffusion 14 and n moat diffusion 20 can not source or sink current if they are not damaged.

Figure 9:
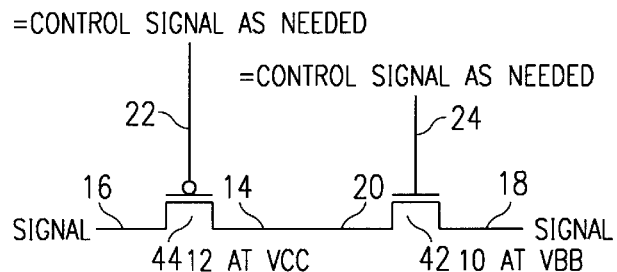

In a sixth embodiment of the invention, the pn junction of P moat diffusion 14 to N tank diffusion 12 is damaged away from, gate 22, or the pn junction of N moat diffusion 20 to P substrate 10 is damaged away from gate 24, in the previously discussed manner. An available electrical equivalent circuit is shown in FIG. 9. Damage to the pn junction of P moat diffusion 14 to N tank diffusion 12 results in transistors 42 and 44 having a voltage out of Vcc. Damage to the pn junction of P moat diffusion 20 to P substrate 10 results in transistors 42 and 44 having a voltage out of Vbb. It should be noted that a Vbb of −4 volts may make the circuit non functional. This embodiment works best when Vbb=Vss.

Figure 10:
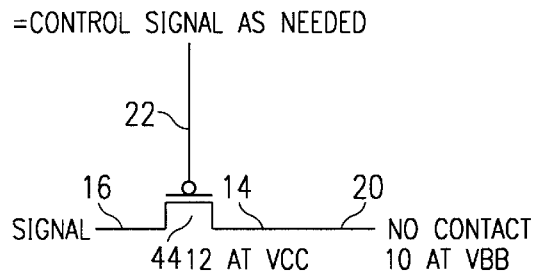

In a seventh embodiment of the invention, the pn junction of P moat diffusion 14 to N tank diffusion 12 is damaged away from gate 22, or the pn junction of N moat diffusion 20 to P substrate 10 is damaged in the previously discussed manner. An available electrical equivalent circuit is shown in FIG. 10. Damage to the pn junction of P moat diffusion 14 to N tank diffusion 12 results in transistor 44 having a voltage out of Vcc. Damage to the pn junction of N moat diffusion 20 to P substrate 10 results in transistor 44 having a voltage out of Vbb. It should be noted that a Vbb of −4 volts may make the circuit non functional. This embodiment is optimum when Vbb=Vss.

Figure 11:
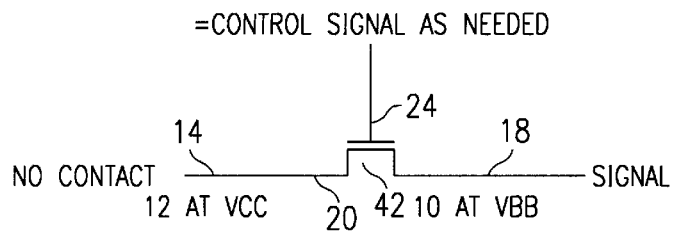

In an eighth embodiment of the invention, the pn junction of N moat diffusion 14 to N tank diffusion 12 is damaged, or the pn junction of N moat diffusion 20 to P substrate 10 is damaged away from gate 22, in the previously discussed manner. An available electrical equivalent circuit is shown in FIG. 11. Damage to the pn junction of P moat diffusion 14 to N tank diffusion 12 results in transistor 42 having a voltage out of Vcc. Damage to the pn junction of N moat diffusion 20 and P substrate 10 results in transistor 42 having a voltage out of Vbb. This circuit is optimum when Vbb=Vss. A Vbb of −4 volts may make the circuit non functional.

Figure 12:
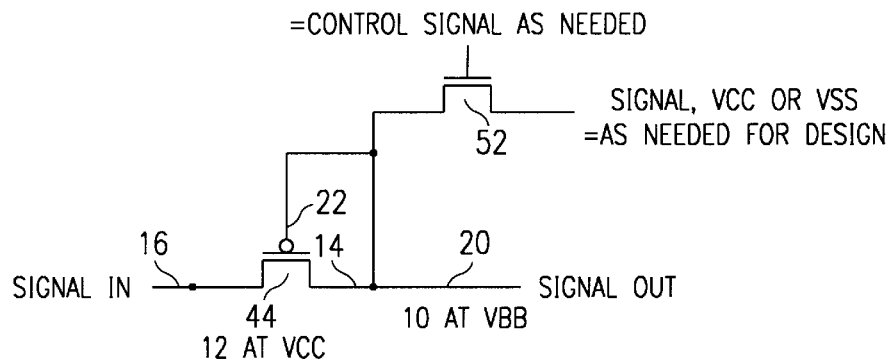

In a ninth embodiment of the invention, the pn junction of P moat diffusion 14 to N tank diffusion 12 is damaged away from gate 22, in the previously discussed manner. The pn junction of N moat diffusion 20 to P substrate 10 may also be damaged in the previously discussed manner. An available electrical equivalent circuit is shown in FIG. 12. Damage to the pn junction P Moat diffusion 14 to N tank 12 will result in transistor 44 being turned off and a signal out of Vcc. Damage to the pn junction of N moat diffusion 20 to P substrate 10 is only allowed if the signal in is to be modified and/or the leakage to substrate tolerated.

Figure 13:
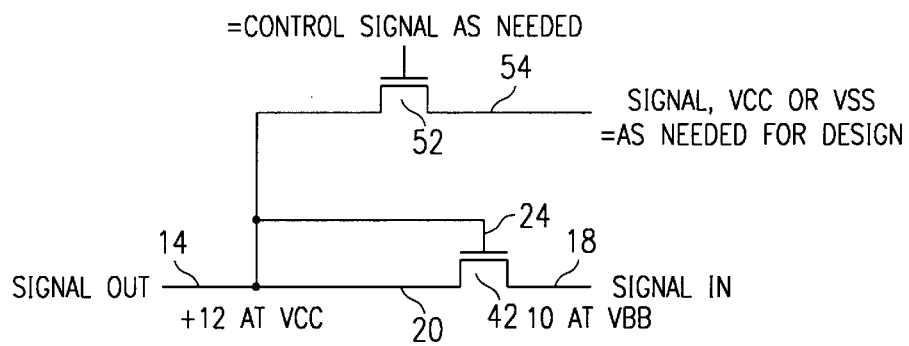

In a tenth embodiment of the invention, the pn junction of N moat diffusion 20 to P substrate 10 is damaged away from gate 24, in the previously discussed manner. The pn junction of P moat diffusion 14 to N tank diffusion may also be damaged in the previously discussed manner. An available electrical equivalent circuit is shown in FIG. 13. Damage to the pn junction of N moat 20 to P substrate 10 will result in transistor 42 being turned off and a signal out of Vbb. This circuit may not be useful for circuit designs requiring a Vbb of −4 volts. Damage to the pn junction of P moat diffusion 14 to N tank 12 is only allowed if the signal in is to be modified and/or the leakage to the tank tolerated.

Figure 14:
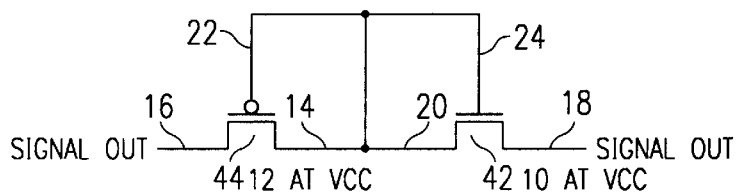

In an eleventh embodiment of the invention, the pn junction of P moat diffusion 14 to N tank diffusion 12 is damaged away from gate 22, or the pn junction of N moat diffusion 20 to P substrate 10 is damaged away from gate 24, in the previously discussed manner. An available electrical equivalent circuit is shown in FIG. 14. Damage to either pn junction will result in control of gates 22 and 24 of transistors 44 and 42, respectively. If neither pn junction is damaged, no current may be sourced from them. Transistors 44 and 42 may float but since they are a complementary pair there is little chance the two signal outs will communicate with one another as any attempt would shut off one of the transistors.

Figure 15:
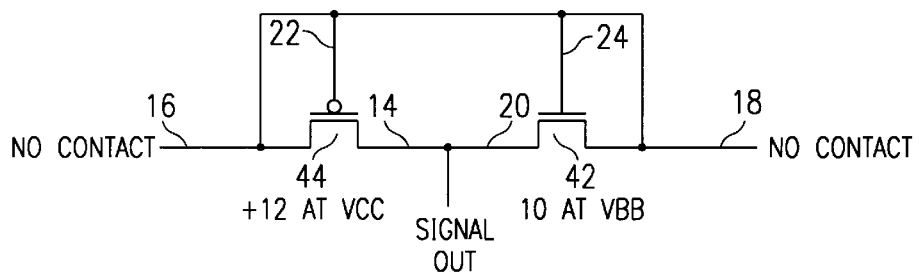

In a twelfth embodiment of the invention, the pn junction of P moat diffusion 16 to N tank diffusion 12 is damaged away from gate 22, or the pn junction of N moat diffusion 20 to P substrate 10 is damaged away from gate 24, in the previously discussed manner. An available electrical equivalent circuit is shown in FIG. 15. Damage to the pn junction of P moat diffusion 16 to N tank diffusion 12 will result in a signal out of Vcc. Damage to the pn junction of N moat diffusion 20 to P substrate 10 will results in a signal out of Vbb.

As can be seen from the circuit drawings in the preceding discussion, there are many circuit possibilities. Some are better than others but most are compromised when the Vbb is at −4 volts. Thus, if the damage is to the pn junction of P moat diffusion 16 to N tank diffusion 12, few problems result even if Vbb is at −4 volts. The voltage level presented to the other circuits is the same as that of normal design considerations. Further, the leakage of the pn junction to the N tank diffusion 12 goes out through the tank connection which is to Vcc. N tank diffusion 12 is connected directly to Vcc thus there is no worry about the current drawn by the charge pumps. No redesign is needed to implement the use of a negative substrate voltage.

If the pn junction between P moat diffusion 14 and N tank diffusion 12 is damaged, the damaged junction can be connected through a jumper to n moat diffusion 20 without an increase in operational stress. In this case, no isolation transistor is required since the voltage on the pn junction is the same as normal operation for that junction, Vcc+Vbb. If, on the other hand, the pn junction of N moat diffusion 20 to P substrate 10 is damaged and jumpered to p moat diffusion 14, there will be more stress across the pn junction of P moat diffusion 14 to N tank 12 because the voltage across the junction will be Vcc+Vbb.

The bleeder transistor 52 is not necessary if the transistor gates being connected can float without causing a problem. For example, if redundancy is implemented to allow the gates to float when no redundant circuits are activated, then the bleeder transistors are not needed. When redundancy is activated, all junctions required to hold the gates at a known voltage are damaged. Therefore, there are no active gates which are floating. Circuits, like the ones shown in the figures, can be used to change the functionality of a microprocessor or to replace defective circuits.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor device, comprising:
   a substrate;
   a shallow tank in said substrate, said shallow tank having a conductivity type opposite the conductivity type of said substrate;
   a first source/drain region in said shallow tank, said first source/drain region having a conductivity type opposite the conductivity type of said shallow tank;
   a second source/drain region in said shallow tank, said second source/drain region being spaced from said first source/drain region and having a conductivity type opposite the conductivity type of said shallow tank;
   a gate having a first end adjacent said first source/drain region and a second end adjacent said second source/drain region; and
   a low resistance programmed area within one and only one of said source/drain regions at a junction of said source/drain region and said shallow tank, said low resistance programmed area being spaced laterally from said gate.

2. A device according to claim 1, wherein said substrate is biasable with a negative voltage.

3. A device according to claim 1, wherein said shallow tank region is biasable with a positive voltage.

4. A device according to claim 1, wherein said shallow tank has sufficient depth within said semiconductor body to avoid thermal damage to said tank during programming of said junction of source/drain region and said shallow tank.

5. A device according to claim 1, wherein said semiconductor device is a CMOS device.

6. A device according to claim 1, wherein said semiconductor device is an NMOS semiconductor device having a substrate that is biasable with a negative voltage.

7. A device according to claim 1, wherein said low resistance programmed area is formed by a laser beam.

8. A device according to claim 1, wherein said low resistance programmed area within one and only one of said source/drain regions at a junction of said source/drain region does not contact an adjacent field oxide region.

* * * * *